(12) United States Patent
Marr et al.

(10) Patent No.: US 6,172,899 B1
(45) Date of Patent: Jan. 9, 2001

(54) STATIC-RANDOM-ACCESS-MEMORY CELL

(75) Inventors: Ken Marr, Boise; H. Montgomery Manning, Eagle, both of ID (US)

(73) Assignee: Micron Technology. Inc., Boise, ID (US)

( * ) Notice: Under 35 U.S.C. 154(b), the term of this patent shall be extended for 0 days.

(21) Appl. No.: 09/074,952

(22) Filed: May 8, 1998

(51) Int. Cl.[7] .................................................. G11C 11/00
(52) U.S. Cl. .................................... 365/154; 365/156
(58) Field of Search .................................. 365/154, 156, 365/177, 230.06

(56) References Cited

U.S. PATENT DOCUMENTS

| | | | |
|---|---|---|---|
| 4,653,025 | * 3/1987 | Minato et al. | 365/154 |
| 4,796,227 | 1/1989 | Lyon et al. | 365/154 |
| 5,453,949 | * 9/1995 | Wiedmann et al. | 365/154 |
| 5,521,861 | * 5/1996 | Lee et al. | 365/156 |
| 5,771,190 | * 6/1998 | Okamura | 365/154 |
| 5,852,572 | * 12/1998 | Jung et al. | 365/156 |

OTHER PUBLICATIONS

Lyon, Richard F. and Schediwy, Richard R., "*CMOS Static Memory with a New Four–Transistor Memory Cell*", Advanced Resarch I VLSI, Proceedings of the 1987 Stanford Conference, pp. 110–132.

Matsui, K. et al., *1.9–$\mu m^2$ Loadless CMOS Four–Transistor SRAM Cell in a 0.18–$\mu m$ Logic Technology*, 1998 IEEE, pp. 22.8.1–22.8.4.

* cited by examiner

*Primary Examiner*—Vu A. Le
(74) *Attorney, Agent, or Firm*—Dorsey & Whitney LLP

(57) ABSTRACT

A 4-T SRAM cell includes access transistors of a first type and cell (pull-up or pull-down) transistors of a second type. For example, the cell includes PMOS access transistors and NMOS pull-down transistors. The cell may also include leaky-junction or Schottky loads.

37 Claims, 7 Drawing Sheets

STATIC-RANDOM-ACCESS-MEMORY CELL

TECHNICAL FIELD

The invention relates generally to integrated circuits and more specifically to a static-random-access-memory (SRAM) cell that is suitable for use with low supply voltages, that has a reduced size as compared with conventional SRAM cells, or both.

BACKGROUND OF THE INVENTION

To meet customer demand for smaller and more power efficient integrated circuits (ICs), manufacturers are designing newer ICs that operate with lower supply voltages and that include smaller internal subcircuits such as memory cells. Many ICs, such as memory circuits or other circuits such as microprocessors that include onboard memory, include one or more SRAM cells for data storage. SRAM cells are popular because they operate at a higher speed than dynamic-random-access-memory (DRAM) cells, and as long as they are powered, they can store data indefinitely, unlike DRAM cells, which must be periodically refreshed.

FIG. 1 is a circuit diagram of a conventional 6-transistor (6-T) SRAM cell 10, which can operate at a relatively low supply voltage, for example 2.2V–3.3V, but which is relatively large. A pair of NMOS access transistors 12 and 14 allow complementary bit values D and $\overline{D}$ on digit lines 16 and 18, respectively, to be read from and to be written to a storage circuit 20 of the cell 10. The storage circuit 20 includes NMOS pull-down transistors 22 and 26, which are coupled in a positive-feedback configuration with PMOS pull-up transistors 24 and 28. Nodes A and B are the complementary inputs/outputs of the storage circuit 20, and the respective complementary logic values at these nodes represent the state of the cell 10. For example, when the node A is at logic 1 and the node B is at logic 0, then the cell 10 is storing a logic 1. Conversely, when the node A is at logic 0 and the node B is at logic 1, then the cell 10 is storing a logic 0. Thus, the cell 10 is bistable, i.e., can have one of two stable states, logic 1 or logic 0.

In operation during a read of the cell 10, a word-line WL, which is coupled to the gates of the transistors 12 and 14, is driven to a voltage approximately equal to Vcc to activate the transistors 12 and 14. For example purposes, assume that Vcc=logic 1=5V and Vss=logic 0=0V, and that at the beginning of the read, the cell 10 is storing a logic 0 such that the voltage level at the node A is 0V and the voltage level at the node B is 5V. Also, assume that before the read cycle, the digit lines 16 and 18 are equilibrated to approximately Vcc. Therefore, the NMOS transistor 12 couples the node A to the digit line 16, and the NMOS transistor 14 couples the node B to the digit line 18. For example, assuming that the threshold voltages of the transistors 12 and 14 are both 1V, then the transistor 14 couples a maximum of 4V from the digit line 18 to the node B. The transistor 12, however, couples the digit line 16 to the node A, which pulls down the voltage on the digit line 16 enough (for example, 100–500 millivolts) to cause a sense amp (not shown) coupled to the lines 16 and 18 to read the cell 10 as storing a logic 0.

In operation during a write, for example, of a logic 1 to the cell 10, and making the same assumptions as discussed above for the read, the transistors 12 and 14 are activated as discussed above, and logic 1 is driven onto the digit line 16 and a logic 0 is driven onto the digit line 18. Thus, the transistor 12 couples 4V (the 5V on the digit line 16 minus the 1V threshold of the transistor 12) to the node A, and the transistor 14 couples 0V from the digit line 18 to the node B. The low voltage on the node B turns off the NMOS transistor 26, and turns on the PMOS transistor 28. Thus, the inactive NMOS transistor 26 allows the PMOS transistor 28 to pull the node A up to 5V. This high voltage on the node A turns on the NMOS transistor 22 and turns off the PMOS transistor 24, thus allowing the NMOS transistor 22 to reinforce the logic 0 on the node B. Likewise, if the voltage written to the node B is 4V and that written to the node A is 0V, the positive-feedback configuration ensures that the cell 10 will store a logic 0.

Because the PMOS transistors 26 and 28 have low on resistances (typically on the order of a few kilohms), they can pull the respective nodes A and B virtually all the way up to Vcc often in less than 10 nanoseconds (ns), and thus render the cell 10 relatively stable and allow the cell 10 to operate at a low supply voltage as discussed above. But unfortunately, the transistors 26 and 28 cause the cell 10 to be approximately 30%–40% larger than a 4-transistor (4-T) SRAM cell, which is discussed next.

FIG. 2 is a circuit diagram of a conventional 4-T SRAM cell 30, where elements common to FIGS. 1 and 2 are referenced with like numerals. A major difference between the 6-T cell 10 and the 4-T cell 30 is that the PMOS pull-up transistors 26 and 28 of the 6-T cell 10 are replaced with conventional passive loads 32 and 34. For example, the loads 32 and 34 are often polysilicon resistors. Otherwise the topologies of the 6-T cell 10 and the 4-T cell 30 are the same. Furthermore, the 4-T cell 30 operates similarly to the 6-T cell 10. Because the loads 32 and 34 are usually built in another level above the access transistors 12 and 14 and the NMOS pull-down transistors 22 and 26, the 4-T cell 30 usually occupies much less area than the 6-T cell 10. But as discussed below, the high resistance values of the loads 32 and 34 can substantially lower the stability margin of the cell 30 as compared with the cell 10. Thus, under certain conditions, the cell 30 can inadvertently become monostable or read unstable instead of bistable. Also, the cell 30 consumes more power than the cell 20 because there is always current flowing from Vcc to Vss through either the load 32 and the NMOS transistor 24 or the load 34 and the NMOS transistor 22. In contrast, current flow from Vcc to Vss in the cell 20 is always blocked by one of the NMOS/PMOS transistor pairs 22/24 and 26/28.

Still referring to FIG. 2, the cell 30 is monostable when it can store only one logic state instead of two when the access transistors 12 and 14 are in the off state. More specifically, in order to minimize the quiescent current, and thus the quiescent power, drawn by the cell 30, the loads 32 and 34 have relatively high resistance values, often on the order of megaohms or gigaohms. But offset currents, typically on the order of picoamps (pA), often flow from the nodes A and B. These offset currents are typically due to the leakage currents, the subthreshold currents, or both generated by the transistors 12, 14, 22, and 24 when they are in an off state. To prevent these offset currents from causing the cell 30 to spontaneously change states, the loads 32 and 34 must have values low enough so that when the transistors 12 and 26 and 14 and 22 are off, the currents that flow from Vcc to the nodes A and B are greater than or equal to these respective offset currents. For example, suppose that initially the cell 30 is storing a logic 1 such that the voltage at the node A is approximately 5V and the voltage at the node B is approximately 0V. Furthermore, suppose that the total offset current drawn from the node A is 10 pA. If the load 32 allows only 5 pA to flow from Vcc to the node A, then the larger offset current will gradually discharge the parasitic capacitance (not shown in FIG. 2) associated with the node A, thus lowering the voltage at the node A until the transistor 22 turns off. At this point, assuming that the current through the load 34 is greater than the offset current drawn from the node B, then the voltage at the node B gradually increases until the transistor 26 turns on and thus pulls the node A to 0V. Thus, in this example, the cell 30 has only one stable state, logic 0, when the access transistors 12 and 14 are off, and is therefore monostable. That is, even if a logic 1 is written to it, the cell 30 will eventually and spontaneously flip to a logic 0.

Still referring to FIG. 2, even when the cell 30 is bistable, it may still be read unstable. Read instability occurs when the cell 30 has only one stable logic state when the access transistors 12 and 14 are on, as they are during a read. Therefore, the cell 30 may be able to stably store a logic 1 or logic 0 that is written to it, but when the access transistors 12 and 14 are activated during a read (when there are no write voltages driven onto the digit lines 16 and 18), the cell 30 becomes read-monostable. If the logic state last written to the cell 30 is opposite the read-monostable state, then the cell 30 will spontaneously flip states.

FIG. 3A is a graph showing the behavior of a first branch of the cell 30 that includes the access transistor 12 and the pull-down transistor 26. $V_A$ is the voltage at the node A of FIG. 2, and $V_B$ is the voltage at the node B, which is also the input voltage to the gate of the transistor 26. Region C is where the transistor 12 is on and the transistor 26 is off, region B is where both the transistors 12 and 26 are on and in saturation, and region E is where both the transistors 12 and 26 are on but the transistor 26 is in the linear region, thus forcing node A to a low value. Processing variations in the transistors 12 and 26, or changes in Vcc, the back-bias voltage applied to the substrate (not shown in FIG. 2) of the circuit, or in the voltage at the node A immediately after the transistor 12 is turned on may change the shape of the curve. Furthermore, a similar analysis of a second branch of the cell 30 that includes the access transistor 14 and the pull-down transistor 22 yields a similar curve.

FIG. 3B shows the curve for the first branch of the cell 30 overlaid with the curve for the second branch of the cell 30 when the cell 30 is read stable. Point F is the stable logic 1 state of the cell 30 where the voltage at the node A ($V_{A1}$) is logic 1, and the voltage at the node B ($V_{B1}$) is logic 0. Point G represents the metastable midpoint where both nodes A and B are equal. Point H is the stable logic 0 state of the cell 30 where the voltage at the node A ($V_{A0}$) is logic 0 and the voltage at the node B ($V_{B0}$) is logic 1. The distances I and J are the maximum widths of the respective lobes formed by the overlaid curves. The smaller of the distances I and J is sometimes referred to as the static noise margin (SNM), which is a measure of the stability of the cell 30.

FIG. 3C is an overlay of the curves of FIG. 3B when the cell 30 is read unstable and has only one stable point F when the transistors 12 and 14 are on. A reduction in Vcc will reduce the heights of the curves of FIGS. 3A and 3B, and thus increase the chances of read instability. Furthermore, because the transistors 12 and 14 are NMOS transistors, the maximum logic 1 voltage that can be coupled to the nodes A and B (from the equilibrated digit lines 16 and 18, respectively) during a read is Vcc minus the threshold of the respective transistor 12 and 14. This also reduces the heights of the curves of FIGS. 3A and 3B, and thus also increases the chances of read instability. Furthermore, as discussed in more detail below, a low logic 1 voltage at the node A or B immediately following the activation of the access transistors 12 or 14, respectively, may cause such a reduction in the height of the curves. For example, again referring to FIG. 2, assume that the offset current drawn from the node A is 10 pA, but that the load 32 allows a current greater than 10 pA, e.g., 12–15 pA, to flow from Vcc to the node A such that the cell 30 is bistable when the transistors 12 and 14 are off. Furthermore, assume that a logic 1 is written to the cell 30, and that as above, Vcc=logic 1=5V, Vss=logic 0=0V, and the thresholds of the transistors 12 and 14=1V. During such a write, approximately 4V (5V on the digit line 16 minus the 1V threshold of the transistor 12) is coupled to the node A and approximately 0V is coupled to the node B from the digit line via the transistor 14. Next, assume that before the positive feedback action of the circuit 21 has a chance to fully charge the node A to 5V (this could take on the order of one nanosecond), the cell 30 is read. (A read may occur tens to hundreds of nanoseconds after a write.) Thus, the effective lowering of the voltage on the node A from 5 volts to 4 volts after the transistors 12 and 14 are activated may be sufficient to cause the cell 30 to have the characteristics shown in FIG. 3C, thus causing the cell 30 to be read unstable.

Therefore, as stated above, as Vcc is reduced, the probability increases that the cell 30 may be either monostable or read unstable. Thus, although the 4-T cell 30 is physically smaller than the 6-T cell 10 of FIG. 1, it is much less suitable for operation at low supply voltages.

SUMMARY OF THE INVENTION

In one embodiment of the invention, a bistable memory cell includes first and second access terminals that respectively receive first and second complementary data signals having respective first and second voltage levels. The memory cell also includes first and second data nodes, and first and second supply terminals that respectively receive a first supply voltage approximately equal to the first voltage level and a second supply voltage approximately equal to the second voltage level. Additionally, the memory cell includes first and second access transistors of a first type, first and second cell transistors of a second type, and first and second loads. The first access transistor is coupled to the first access terminal and to the first data node and couples substantially all of the first voltage level to the first data node when the first access terminal receives the first data signal. The second access transistor is coupled to the second access terminal and to the second data node and couples substantially all of the first voltage level to the second data node when the second access terminal receives the first data signal. The first cell transistor is coupled to the second supply terminal and to the first data node and pulls the first data node to approximately the second supply voltage when the second data node is at approximately the first voltage level. The second cell transistor is coupled to the second supply terminal and to the second data node and pulls the second data node to approximately the second supply voltage when the first data node is at approximately the first voltage level. The first load is coupled to the first supply terminal and to the first data node and pulls the first data node to approximately the first supply voltage when the second data node is at approximately the second voltage level. And the second load is coupled to the first supply terminal and to the second data node and pulls the second data node to approximately the first supply voltage when the first data node is at approximately the second voltage level.

Such a memory cell is approximately as small as a conventional 4-T cell, but can operate at a significantly lower supply voltage than a conventional 4-T cell. In other words, the memory cell includes the small-size advantage of a conventional 4-T cell and the low-supply-operation advantage of a conventional 6-T cell. Furthermore, in another embodiment of the invention, the first and second loads are significantly smaller than conventional loads or are altogether eliminated such that the memory cell requires fewer processing steps and layers, and thus is significantly less complex than a conventional 4-T cell.

DETAILED DESCRIPTION OF THE INVENTION

Figure 1:
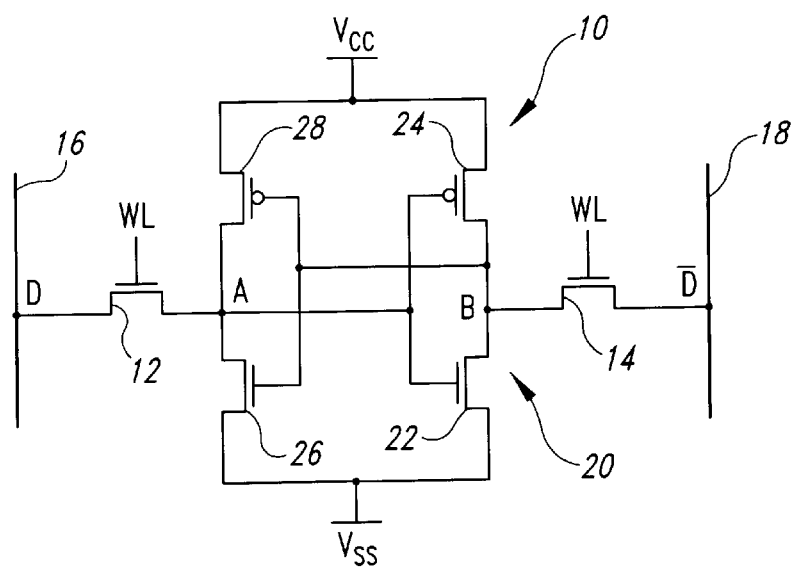
FIG. 1 is a circuit diagram of a conventional 6-T SRAM cell.
Figure 3A:
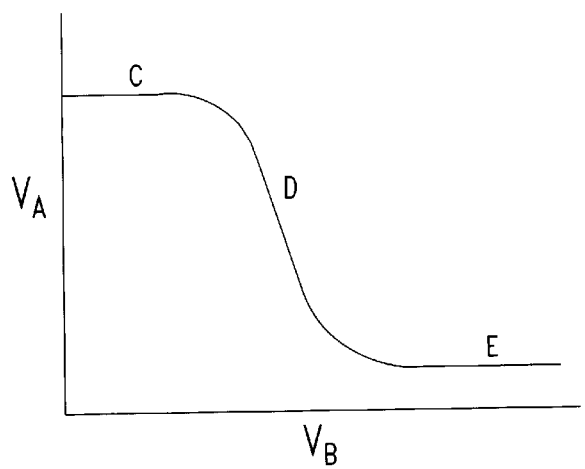
FIGS. 3A–3C are graphs showing the read characteristics of the 4T-SRAM cell of FIG. 2.
Figure 3B:
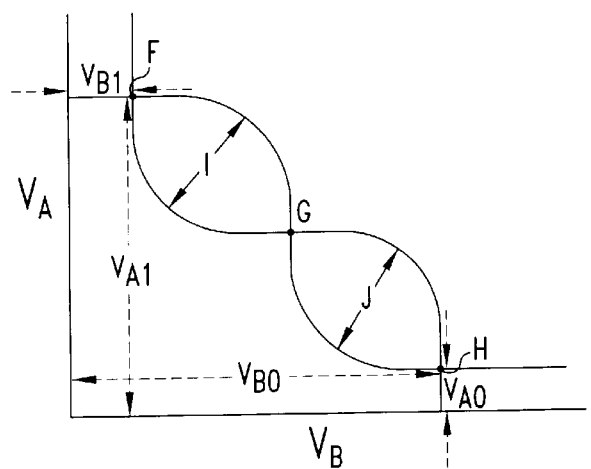
Figure 3C:
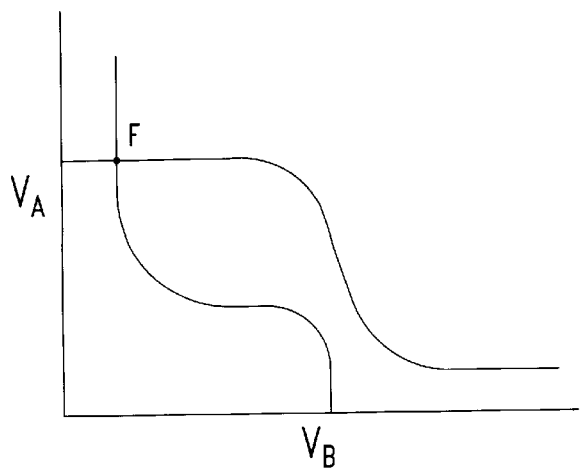
Figure 4:
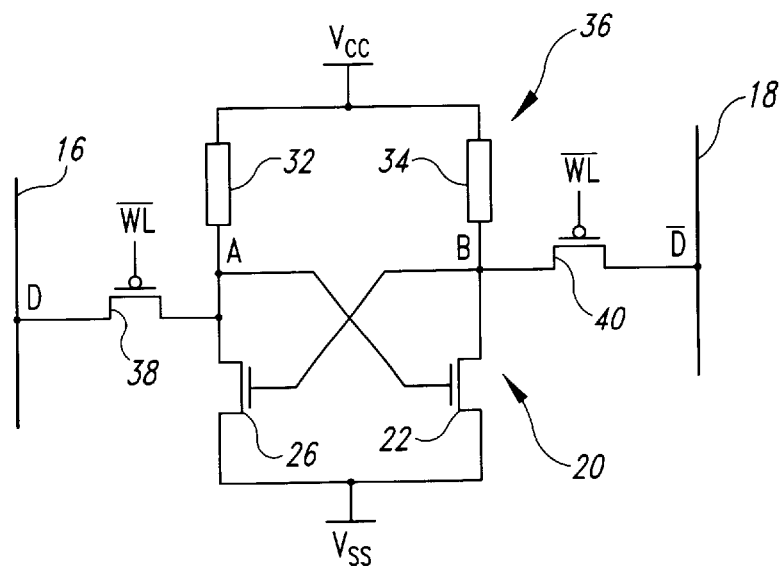
FIG. 4 is a circuit diagram of a 4-T SRAM cell according to an embodiment of the invention.

FIG. 4 is a circuit diagram of a 4-T SRAM cell 36 according to an embodiment of the invention. In FIG. 3, like reference numerals are used to indicate elements that are common to FIGS. 1, 2 and 3.

Figure 2:
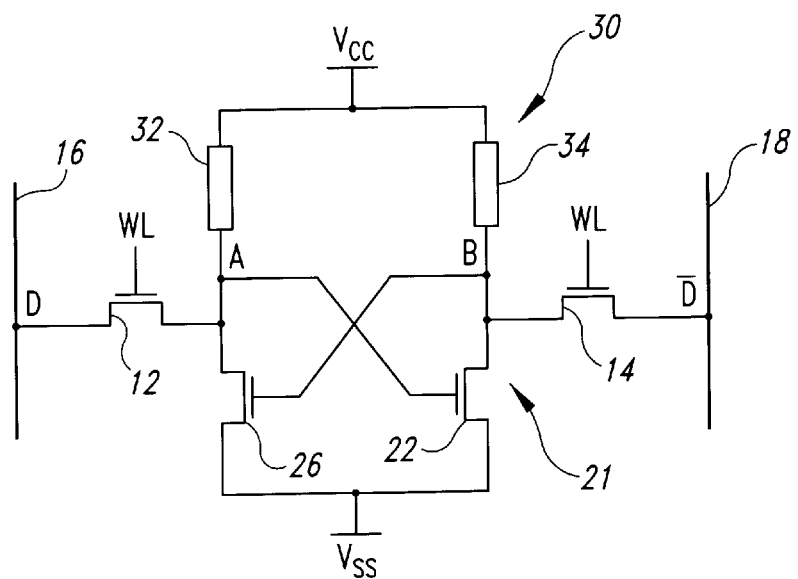
FIG. 2 is a circuit diagram of a conventional 4-T SRAM cell.

A major difference between the cell 36 and the cell 30 of FIG. 2 is that the NMOS access transistors 12 and 14 of the cell 30 are replaced with PMOS access transistors 38 and 40. Otherwise, the cells 30 and 36 have the same topology. But unlike the NMOS access transistors 12 and 14, the PMOS access transistors 38 and 40 substantially fully couple the logic 1 voltage Vcc to the respective node A or B during a write cycle and during a read cycle. (Before a read cycle, both digit lines 16 and 18 are equilibrated to approximately Vcc.) Thus, the PMOS access transistors 38 and 40 make the cell 36 much less susceptible to read instability, thus allowing the cell 36 to be operated with a low supply voltage, for example, Vcc≦3.3V.

For example, still referring to FIG. 4, assume that Vcc= logic 1=5V, Vss=logic 0=0V, $\overline{WL}$=logic 0 to access the cell 36, the respective thresholds of the transistors 38 and 40 are 1V, and the cell 36 stores a logic 1 when the node A is at logic 1 and the node B is at logic 0. When the cell 36 is read, the respective transistor 38 or 40 couples substantially the full 5V from the respective equilibrated digit line 16 or 18 to the logic 1 node A or B. Thus, because during a read cycle the voltage at the logic 1 node A or B is maintained at approximately 5V (and not 4V as discussed in conjunction with FIG. 3C for the conventional cell 30 of FIG. 2), there is less likelihood that the cell 36 will be read unstable. That is, the use of the PMOS access transistors 38 and 40 with the NMOS pull-down transistors 22 and 24 increases the read margin of the cell 36, and thus significantly reduces the likelihood of read instability. Likewise, a similar analysis can be made when the cell 36 is read shortly after being written with a logic 0.

Figure 5:
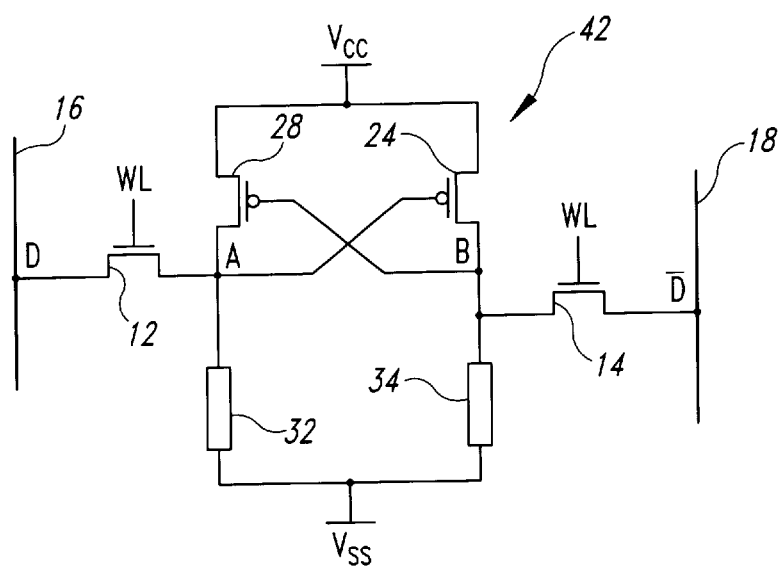
FIG. 5 is a circuit diagram of a 4-T SRAM cell according to another embodiment of the invention.

FIG. 5 is a circuit diagram of a cell 42 according to a second embodiment of the invention, where like reference numerals are used to indicate elements that are common to FIGS. 1, 2, 3, and 4. The cell 42 is complementary to the cell 36 of FIG. 3. That is, the NMOS access transistors 12 and 14 replace the PMOS access transistors 38 and 40, the PMOS pull-up transistors 24 and 28 replace the loads 32 and 34, and the loads 32 and 34 replace the NMOS pull-down transistors 22 and 26. The cell 42, like the cell 36, is also much less susceptible to read instability than the conventional 4-T cell 30 of FIG. 2, and thus can be operated with a low supply voltage.

For example, still referring to FIG. 5 and making the same assumptions as in the example discussed above in conjunction with FIG. 3, when a logic 0 is written to the cell 42, the transistor 12 fully couples 0V from the digit line 16 to the node A, and the transistor 14 couples 4V from the digit line 18 to the node B. Thus, during a quickly following read of the cell 42, the initial voltage at the node A is 0V, making it less likely that the cell 42 will be made read unstable. That is, the use of the NMOS access transistors 12 and 14 with the PMOS pull-up transistors 24 and 28 increases the read margin of the cell 42, and thus significantly reduces the likelihood of read instability. Likewise, a similar analysis can be made when the cell 41 is read shortly after being written with a logic 1.

Figure 6:
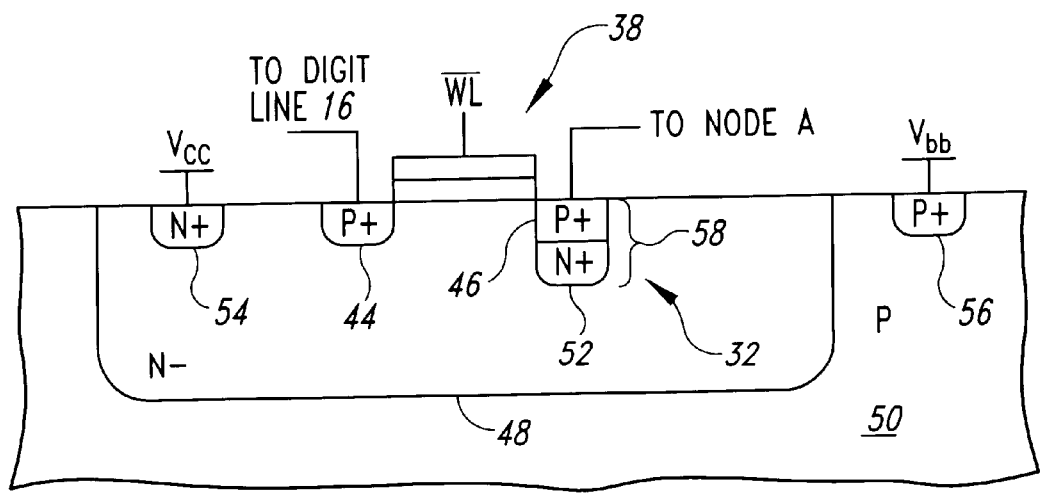
FIG. 6 is a cross-sectional view of an access transistor and a load according to an embodiment of the invention that can be used with the memory cells of FIGS. 2 and 4.

FIG. 6 is a cross-sectional view of the access transistor 38 and the load device 32 of FIG. 4 according to one embodiment of the invention, it being understood that the transistor 40 and the load 34 of FIG. 4 can have the same structure. The transistor 38 includes P+ source/drain regions 44 and 46, which are respectively coupled to the digit line 16 and to the node A. The regions 44 and 46 are disposed in an N– well 48, which is disposed in a P substrate 50. An N+ leaky region 52 is disposed in the well 48 and is contiguous with the source/drain region 46. An N+ contact region 54 allows the well 48 to be biased to a positive voltage such as Vcc. Likewise, a P+ contact region 56 allows the substrate 50 to be biased to a negative voltage such as Vbb. Without the leaky region 52, the junction of the well 48 and the region 46 would form a reverse-biased diode having a reverse leakage current too low for this diode to be used as the load 32. But because the leaky region 52 is more heavily doped than the well 48, it increases the reverse leakage current of a reversed-biased diode 58 formed by the junction of the regions 46 and 52 such that the diode 58 can be used as the load 32. Such a load 32 is much less complex and requires fewer layers than a conventional load, and thus can significantly reduce the overall cost of the 4-T cell 36 of FIG. 4. Furthermore, in an embodiment where the region 52 is formed beneath the region 46, the load 32 occupies virtually no layout space beyond that already occupied by the access transistor 38. Additionally, the structure of the load 32 can be modified according to conventional principles so as to be useable with the cell 42 of FIG. 5, and the semiconductor regions 44, 46, 48, 50, 52, 54, and 56 can be formed using conventional processing techniques.

Figure 7:
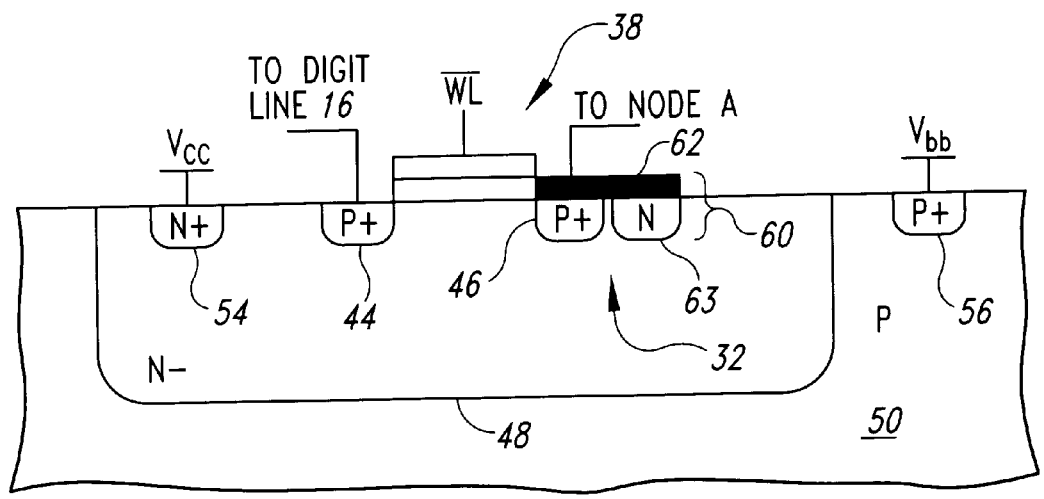
FIG. 7 is a cross-sectional view of an access transistor and a load according to another embodiment of the invention that can be used with the memory cells of FIGS. 2 and 4.

FIG. 7 is a cross-sectional view of the access transistor 38 and the load 32 of FIG. 4 according to a second embodiment of the invention, it being understood that the transistor 40 and the load 34 of FIG. 4 can have the same structure. Furthermore, like reference numerals are used to indicate regions that are common to FIGS. 6 and 7. A major difference between this embodiment and that shown in FIG. 5 is that the reversed-biased diode 58 is replaced by a Schottky diode 60. The diode 60 is formed by the junction of a Schottky-barrier layer 62 and the N-well region 48. The layer 62 is conventionally formed from a conventional barrier material such as titanium silicide. In one embodiment, an N region 63 is formed beneath the Schottky-banier layer 62 to increase the reverse leakage current of the Schottky diode 60, and thus increase the stability of the cell 36 of FIG. 4. Although shown as being laterally spaced from the source/drain region 46, the region 63 may be contiguous therewith. In another embodiment, the layer 62 extends over the source/drain region 46 to form a low-resistance contact thereto and to the node A. Such a load 32 occupies virtually no layout space beyond that already occupied by the access transistor 38, and thus can significantly reduce the overall size of the 4-T cell 36 of FIG. 4. Additionally, the structure of the load 32 can be modified according to conventional principles so as to be useable with the cell 42 of FIG. 5.

Figure 8:
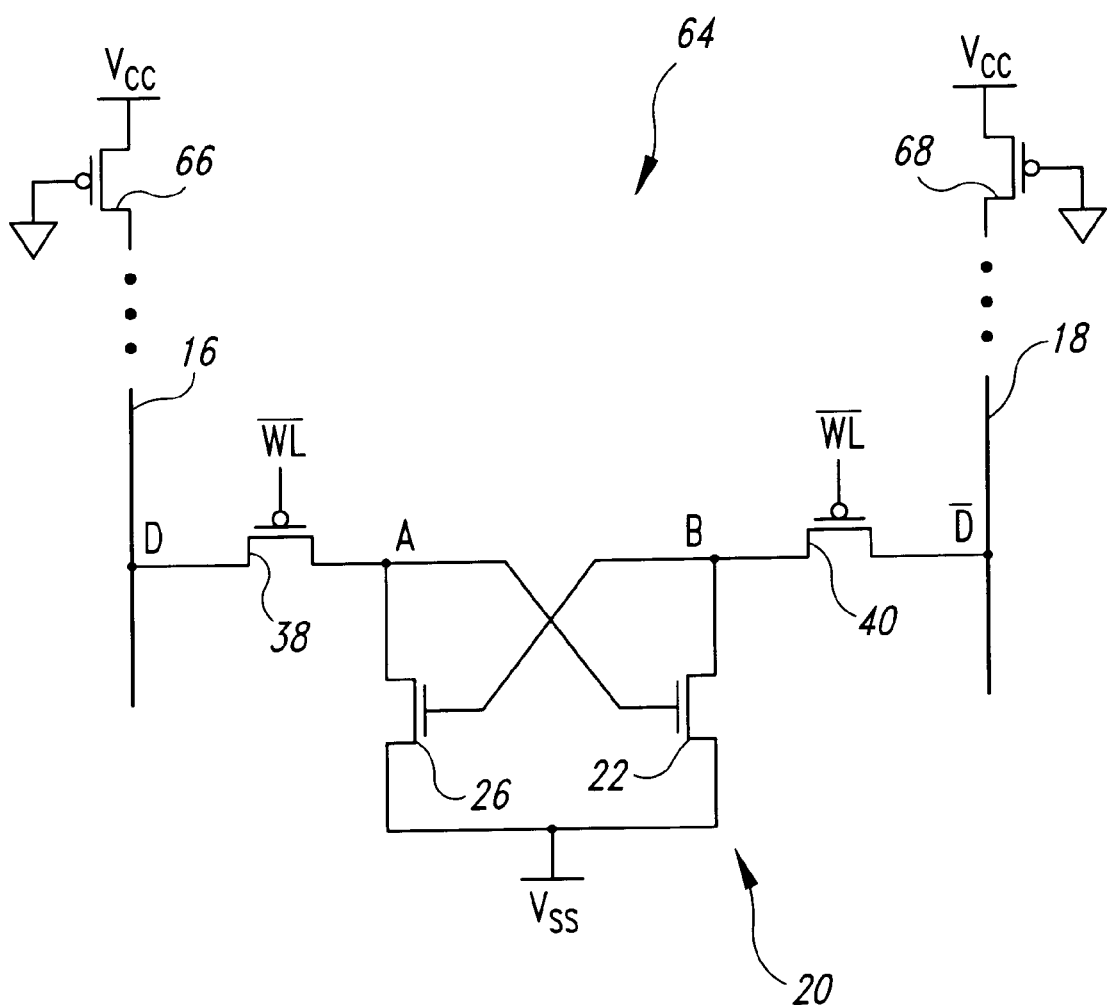
FIG. 8 is a circuit diagram of a 4-T SRAM cell according to yet another embodiment of the invention.

FIG. 8 is a circuit diagram of a cell 64 according to a third embodiment of the invention, where like reference numerals arc used to indicate elements that are common to FIGS. 1–5. The cell 64 is similar to the cell 42 of FIG. 4 except that it does not include the loads 32 and 34. Instead, the thresholds of the transistors 38 and 40 are such that when $\overline{WP}$ is logic 1, they conduct respective subthreshold currents from the digit lines 16 and 18. These subthreshold currents are sufficient to compensate for any leakage or offset currents at the nodes A and B, respectively, and thus stabilize the cell 64 while it is in standby mode, i.e., not being accessed. Although the transistors 38 and 40 may not conduct a subthreshold current while the cell 64 or any other cells coupled to the digit lines 16 and 18 are being accessed, the parasitic capacitances at the nodes A and B are large enough to maintain the voltages at these nodes during such access periods so that the cell 64 does not become unstable. In one embodiment of the invention, the digit lines 16 and 18 are pulled up to Vcc with conventional PMOS pull-up transistors 66 and 68.

The subthreshold currents can be adjusted as needed by conventionally implanting the channel regions of the transistors 38 and 40 with a dopant to adjust the thresholds thereof. In one embodiment, the thresholds of the transistors 38 and 40 are adjusted by implanting the channel regions thereof with a P-type dopant. Because transistor subthreshold currents are well known in the art, they are not further discussed here.

Figure 9:
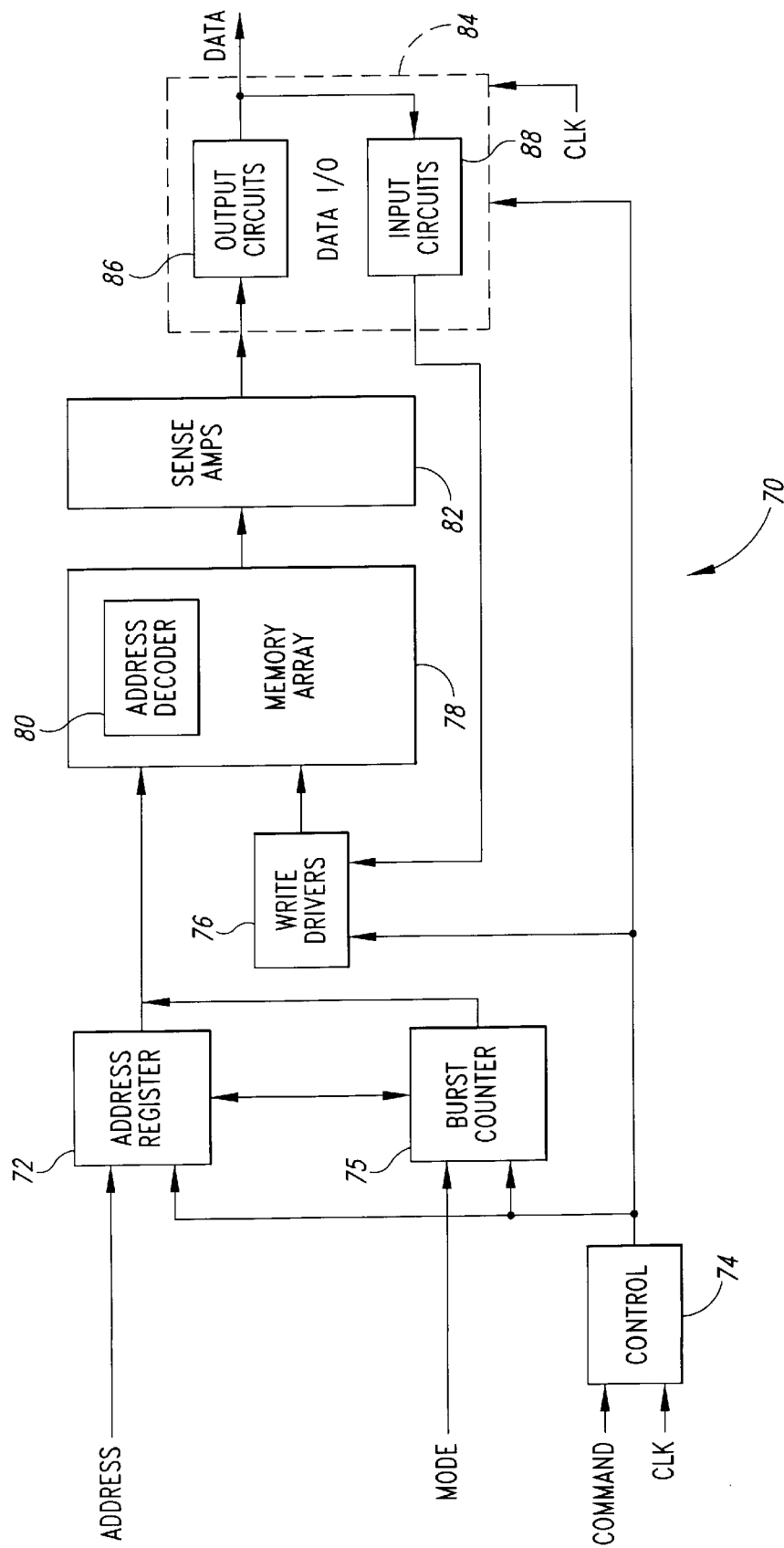
FIG. 9 is a block diagram of a memory circuit that can include the memory cells of FIG. 4, FIG. 5, or FIG. 8, or the loads of FIG. 6 or FIG. 7.

FIG. 9 is a block diagram of a memory circuit 70, which can include the cells 36, 42, and 64 of FIGS. 4, 5, and 8, respectively, and which can include one or both of the diode loads 58 and 60 of FIGS. 6 and 7, respectively. In one embodiment, the memory circuit 70 is a synchronous static random-access memory (SRAM).

The memory circuit 70 includes an address register 72, which receives an address from an ADDRESS bus. A control logic circuit 74 receives a clock (CLK) signal, and receives enable and write signals on a COMMAND bus, and communicates with the other circuits of the memory circuit 70. A burst counter 75 causes the memory circuit 70 to operate in a burst address mode in response to a MODE signal.

During a write cycle, write driver circuitry 76 writes data to a memory array 78. The array 78 is the component of the memory circuit 70 that can include the cells 36, 42, and 64 of FIGS. 4, 5, and 8, respectively. If the cells 36 are included, then they themselves may each include a respective pair of the diode loads 58 or 60 of FIGS. 6 and 7, respectively. The array 78 also includes an address decoder 80 for decoding the address from the address register 72. Alternately, the address decoder 80 may be separate from the array 78.

During a read cycle, sense amplifiers 82 amplify and provide the data read from the array 78 to a data input/output (I/O) circuit 84. The I/O circuit 84 includes output circuits 86, which provide data from the sense amplifiers 82 to the DATA bus during a read cycle. The I/O circuit 84 also includes input circuits 88, which provide data from the DATA bus to the write drivers 76 during a write cycle. The input and output circuits 88 and 86 respectively, may include conventional registers and buffers. Furthermore, the combination of the write driver circuitry 76 and the sense amplifiers 82 can be referred to as read/write circuitry.

Figure 10:
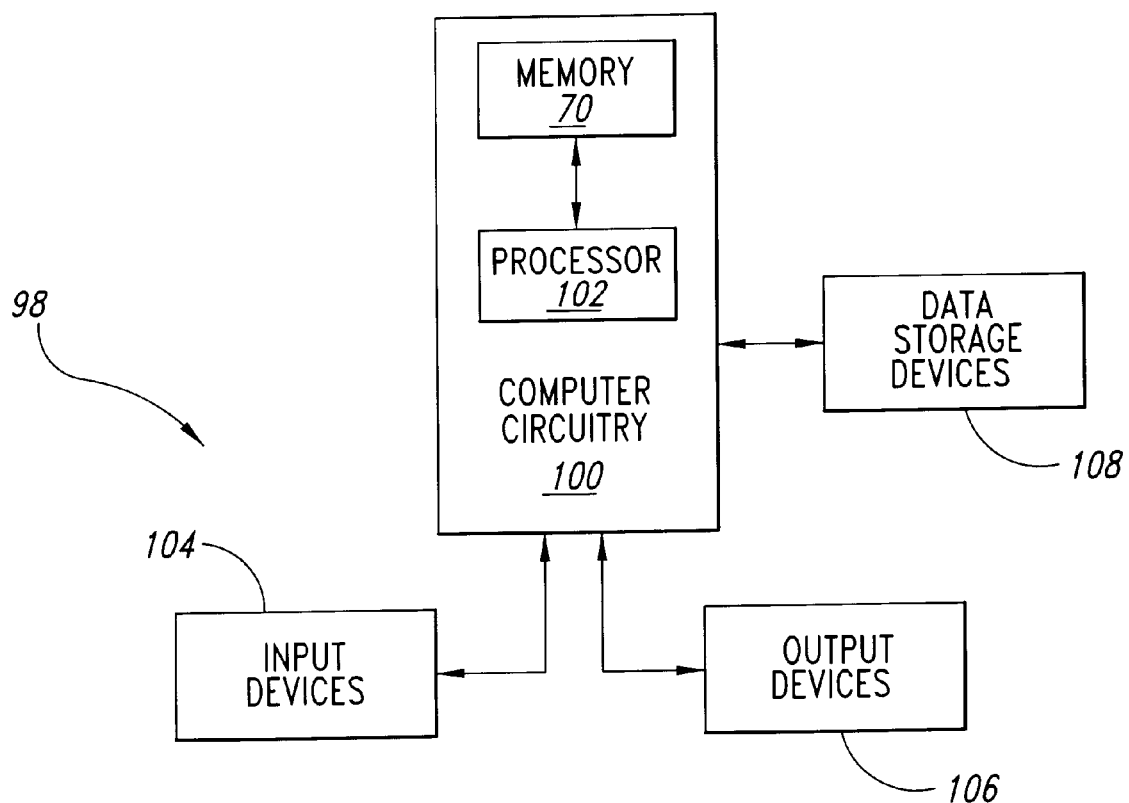
FIG. 10 is a block diagram of a computer system that includes the memory circuit of FIG. 9.

FIG. 10 is a block diagram of an electronic system 98, such as a computer system, that incorporates the memory circuit 70 of FIG. 8. The system 98 includes computer circuitry 100 for performing computer functions, such as executing software to perform desired calculations and tasks. The circuitry 100 typically includes a processor 102 and the memory circuit 70, which is coupled to the processor 102. One or more input devices 104, such as a keyboard or a mouse, are coupled to the computer circuitry 100 and allow an operator (not shown in FIG. 9) to manually input data thereto. One or more output devices 106 are coupled to the computer circuitry 100 to provide to the operator data generated by the computer circuitry 100. Examples of such output devices 106 include a printer and a video display unit. One or more data-storage devices 108 are coupled to the computer circuitry 100 to store data on or retrieve data from external storage media (not shown). Examples of the storage devices 108 and the corresponding storage media include drives that accept hard and floppy disks, tape cassettes, and compact disk read-only memories (CD-ROMs). Typically, the computer circuitry 100 includes address data and command buses and a clock line that are respectively coupled to the ADDRESS, DATA, and COMMAND buses, and the CLK line of the memory circuit 70.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A bistable memory cell, comprising:

first and second access terminals;

first and second data nodes;

first and second supply terminals;

a read-write enable terminal;

a first access transistor of a first type coupled to the first access terminal and the first data node, the first transistor having a control terminal coupled to the enable terminal;

a second access transistor of the first type coupled to the second access terminal and the second data node, the second transistor having a control terminal coupled to the enable terminal;

a first cell transistor of a second type having a source coupled to the first supply terminal and a drain coupled to the first data node, the first cell transistor having a control terminal coupled to the second data node;

a second cell transistor of the second type having a source coupled to the first supply terminal and a drain coupled to the second data node, the second cell transistor having a control terminal coupled to the first data node;

a first diode having a cathode coupled to the second supply terminal and an anode coupled to the first data node; and a second diode having a cathode coupled to the second supply terminal and an anode coupled to the second data node.

2. The memory cell of claim 1 wherein:

the first and second access transistors comprise respective PMOS transistors; and the first and second cell transistors comprise respective NMOS transistors.

3. The memory cell of claim 1 wherein:

the first and second access transistors comprise respective NMOS transistors; and the first and second cell transistors comprise respective PMOS transistors.

4. A bistable memory cell, comprising:

first and second access terminals operable to receive first and second complementary data signals respectively having first and second voltage levels;

first and second data nodes;

first and second supply terminals operable to respectively receive a first supply voltage approximately equal to the first voltage level and a second supply voltage approximately equal to the second voltage level;

a first access transistor of a first type coupled to the first access terminal and the first data node and operable to couple substantially all of the first voltage level to the first data node when the first access terminal receives the first data signal;

a second access transistor of the first type coupled to the second access terminal and the second data node and operable to couple substantially all of the first voltage level to the second data node when the second access terminal receives the first data signal;

a first cell transistor of a second type coupled to the second supply terminal and the first data node and operable to couple substantially all of the second supply voltage to the first data node when the second data node is at approximately the first voltage level;

a second cell transistor of the second type coupled to the second supply terminal and the second data node and operable to couple substantially all of the second supply voltage to the second data node when the first data node is at approximately the first voltage level;

a first load coupled to the first supply terminal and the first data node and operable to pull the first data node to approximately the first supply voltage when the second data node is at approximately the second voltage level, the first load represented by leakage currents through a junction between first and second dopant types; and a second load coupled to the first supply terminal and the second data node and operable to pull the second data node to approximately the first supply voltage when the first data node is at approximately the second voltage level, the second load represented by leakage currents through a junction between the first and second dopant types.

5. The memory cell of claim 4 wherein:

the first and second access transistors comprise respective PMOS transistors; and the first and second cell transistors comprise respective NMOS transistors.

6. The memory cell of claim 4 wherein:

the first and second access transistors comprise respective NMOS transistors; and the first and second cell transistors comprise respective PMOS transistors.

7. The memory cell of claim 4 wherein the first and second voltage levels respectively correspond to a logic 1 and a logic 0.

8. The memory cell of claim 4 wherein the first and second voltage levels respectively correspond to a logic 0 and a logic 1.

9. A static-random-access memory cell, comprising:

first and second access terminals;

first and second data nodes;

first and second supply terminals;

a word-line terminal;

a first PMOS access transistor coupled between the first access terminal and the first data node and having a gate terminal coupled to the word-line terminal;

a second PMOS access transistor coupled between the second access terminal and the second data node and having a gate terminal coupled to the word-line terminal;

a first NMOS pull-down transistor coupled between the first supply terminal and the first data node and having a gate terminal coupled to the second data node;

a second NMOS pull-down transistor coupled between the first supply terminal and the second data node and having a gate terminal coupled to the first data node;

a first reverse biased diode load coupled between the second supply terminal and the first data node; and a second reverse biased diode load coupled between the second supply terminal and the second data node.

10. A bistable memory cell, comprising:

first and second access terminals;

first and second data nodes;

first and second supply terminals;

a read-write enable terminal;

a first access transistor coupled to the first access terminal and to the first data node and having a control terminal coupled to the enable terminal;

a second access transistor coupled to the second access terminal and to the second data node and having a control terminal coupled to the enable terminal;

a first cell transistor coupled to the first supply terminal and to the first data node and having a control terminal coupled to the second data node;

a second cell transistor coupled to the first supply terminal and to the second data node and having a control terminal coupled to the first data node;

a first Schottky diode having a cathode coupled to the second supply terminal and an anode coupled to the first data node; and a second Schottky diode having a cathode coupled to the second supply terminal and an anode coupled to the second data node.

11. The memory cell of claim 10 wherein:

the first and second access transistors comprise respective PMOS transistors; and the first and second cell transistors comprise respective NMOS transistors.

12. A bistable memory cell, comprising:

first and second access terminals operable to receive first and second complementary data signals respectively having first and second voltage levels;

first and second data nodes;

a supply terminal operable to respectively receive a supply voltage approximately equal to the second voltage level;

a first access transistor of a first type coupled to the first access terminal and the first data node and operable to couple substantially all of the first voltage level to the first data node when the first access terminal receives the first data signal, the first access transistor operable to allow a first current to flow from the first access terminal to the first data node when in an off condition;

a second access transistor of the first type coupled to the second access terminal and the second data node and operable to couple substantially all of the first voltage level to the second data node when the second access terminal receives the first data signal, the second access transistor is operable to allow a second current to flow from the second access terminal to the second data node when in an off condition;

a first cell transistor of a second type coupled to the second supply terminal and the first data node and operable to couple substantially all of the second supply voltage to the first data node when the second data node is at approximately the first voltage level; and a second cell transistor of the second type coupled to the second supply terminal and the second data node and operable to couple substantially all of the second supply voltage to the second data node when the first data node is at approximately the first voltage level.

13. The memory cell of claim 12 wherein:

the first and second access transistors comprise respective pmos transistors; and the first and second cell transistors comprise respective nmos transistors.

14. The memory cell of claim 12 wherein:

the first and second access transistors comprise respective nmos transistors; and the first and second cell transistors comprise respective pmos transistors.

15. The memory cell of claim 12 wherein the first and second voltage levels respectively correspond to a logic 1 and a logic 0.

16. The memory cell of claim 12 wherein the first and second voltage levels respectively correspond to a logic 0 and a logic 1.

17. A bistable memory cell formed on a semiconductor substrate, comprising:

first and second access terminals;

a doped region of a first dopant type formed in the semiconductor substrate;

a supply terminal coupled to the doped region;

a read-write enable terminal;

a first access transistor of a first type having first and second source/drain regions of a second dopant type opposite of the first dopant type formed in the doped region, the first source/drain region coupled to the first access terminal, the first transistor further having a control terminal coupled to the enable terminal;

a second access transistor of the first type having, first and second source/drain regions of a second dopant type formed in the doped region, the first source/drain region coupled to the second access terminal, the second transistor further having a control terminal coupled to the enable terminal;

a first cell transistor of a second type coupled to the supply terminal and the second source/drain region of the first access transistor, the first cell transistor further having a control terminal coupled to the second source/drain region of the second access transistor;

a second cell transistor of the second type coupled to the supply terminal and the second source/drain region of the second access transistor, the second cell transistor further having a control terminal coupled to the second source/drain region of the first access transistor;

a first diode load element formed in the doped region, the first diode load element having an anode coupled to the second source/drain region of the first access transistor and a cathode coupled to the supply terminal; and a second diode load element formed in the doped region, the second diode load element having an anode coupled to the second source/drain region of the second access transistor and a cathode coupled to the supply terminal.

18. The memory cell of claim 17 wherein:

the first and second access transistors comprise respective pmos transistors; and the first and second cell transistors comprise respective nmos transistors.

19. The memory cell of claim 17 wherein:

the first and second access transistors comprise respective nmos transistors; and the first and second cell transistors comprise respective pmos transistors.

20. A memory circuit, comprising:

first and second supply terminals;

address, data, and command busses;

an array of memory cells arranged in rows and columns, each of the memory cells respectively comprising, first and second access terminals, first and second data nodes, a read-write enable terminal, a first access transistor of a first type coupled to the first access terminal and the first data node, the first transistor having a control terminal coupled to the enable terminal, a second access transistor of the first type coupled to the second access terminal and the second data node, the second transistor having a control terminal coupled to the enable terminal, a first cell transistor of a second type coupled to the first supply terminal and the first data node, the first cell transistor having a control terminal coupled to the second data node, a second cell transistor of the second type coupled to the first supply terminal and the second data node, the second cell transistor having a control terminal coupled to the first data node, a first diode having a cathode coupled to the second supply terminal and an anode coupled to the first data node, and a second diode having a cathode coupled to the second supply terminal and an anode coupled to the second data node;

an address decoder coupled to the address bus and to the array;

a read/write circuit coupled to the address decoder and to the array;

a data input/output circuit coupled to the data bus and to the read/write circuit; and a control circuit coupled to the command bus, to the address decoder, to the read/write circuit, and to the data input/output circuit.

21. The memory circuit of claim 20 wherein:

the first and second access transistors comprise respective PMOS transistors; and the first and second cell transistors comprise respective NMOS transistors.

22. A memory circuit, comprising:

first and second supply terminals;

address, data, and command busses;

an array of memory cells arranged in rows and columns, each of the memory cells respectively comprising,
first and second access terminals,
first and second data nodes,
a read-write enable terminal,
a first access transistor coupled to the first access terminal and to the first data node and having a control terminal coupled to the enable terminal,
a second access transistor coupled to the second access terminal and to the second data node and having a control terminal coupled to the enable terminal,
a first cell transistor coupled to the first supply terminal and to the first data node and having a control terminal coupled to the second data node,
a second cell transistor coupled to the first supply terminal and to the second data node and having a control terminal coupled to the first data node,
a first Schottky diode having a cathode coupled to the second supply terminal and an anode coupled to the first data mode, and
a second Schottky diode having a cathode coupled to the second supply terminal and an anode coupled to the second data node;

an address decoder coupled to the address bus and to the array;

a read/write circuit coupled to the address decoder and to the array;

a data input/output circuit coupled to the data bus and to the read/write circuit; and a control circuit coupled to the command bus, to the address decoder, to the read/write circuit, and to the data input/output circuit.

23. The memory circuit of claim 22 wherein:

the first and second access transistors comprise respective PMOS transistors; and the first and second cell transistors comprise respective NMOS transistors.

24. A memory circuit, comprising:

a supply terminal;

address, data, and command busses;

an array of memory cells formed on a semiconductor substrate arranged in rows and columns, each of the memory cells respectively comprising,
first and second access terminals,
a doped region of a first dopant type formed in the semiconductor substrate, the doped region coupled to the supply terminal,
a read-write enable terminal;
a first access transistor of a first type having first and second source/drain regions of a second dopant type opposite of the first dopant type formed in the doped region, the first source/drain region coupled to the first access terminal, the first transistor further having a control terminal coupled to the enable terminal,
a second access transistor of the first type having first and second source/drain regions of a second dopant type formed in the doped region, the first source/drain region coupled to the second access terminal, the second transistor further having a control terminal coupled to the enable terminal,
a first cell transistor of a second type coupled to the supply terminal and the second source/drain region of the first access transistor, the first cell transistor further having a control terminal coupled to the second source/drain region of the second access transistor,
a second cell transistor of the second type coupled to the supply terminal and the second source/drain region of the second access transistor, the second cell transistor further having a control terminal coupled to the second source/drain region of the first access transistor,
a first diode load formed in the doped region, the first diode load having an anode coupled to the second source/drain region of the first access transistor and a cathode coupled to the supply terminal, and
a second diode load formed in the doped region, the second diode load having an anode coupled to the second source/drain region of the second access transistor and a cathode coupled to the supply terminal;

an address decoder coupled to the address bus and to the array;

a read/write circuit coupled to the address decoder and to the array;

a data input/output circuit coupled to the data bus and to the read/write circuit; and a control circuit coupled to the command bus, to the address decoder, to the read/write circuit, and to the data input/output circuit.

25. An electronic system, comprising:

a data input device;

a data output device; and computing circuitry coupled to the data input and output devices, the computing circuitry including a memory circuit that includes,
first and second supply terminals,
address, data, and command busses,
an array of memory cells arranged in rows and columns, each of the memory cells respectively comprising,
first and second access terminals,
first and second data nodes,
a read-write enable terminal,
a first access transistor of a first type coupled to the first access terminal and the first data node, the first transistor having a control terminal coupled to the enable terminal,
a second access transistor of the first type coupled to the second access terminal and the second data node, the second transistor having a control terminal coupled to the enable terminal,
a first cell transistor of a second type coupled to the first supply terminal and the first data node, the first cell transistor having a control terminal coupled to the second data node,
a second cell transistor of the second type coupled to the first supply terminal and the second data node, the second cell transistor having a control terminal coupled to the first data node,
a first diode load having a cathode coupled to the second supply terminal and an anode coupled to the first data node, and a second diode having a cathode coupled to the second supply terminal and an anode coupled to the second data node;

an address decoder coupled to the address bus and to the array;

a read/write circuit coupled to the address decoder and to the array;

a data input/output circuit coupled to the data bus and to the read/write circuit; and a control circuit coupled to the command bus, to the address decoder, to the read/write circuit, and to the data input/output circuit.

26. The system of claim 25 wherein:

the first and second access transistors comprise respective PMOS transistors; and the first and second cell transistors comprise respective NMOS transistors.

27. The memory cell of claim 1 wherein each data node comprises a source/drain region of a first dopant type formed in a first doped region of a second dopant type opposite the first dopant type, and the first and second diodes are also formed in the first doped region, the first doped region coupled to the second supply terminal.

28. The memory cell of claim 27 wherein the first and second diodes are pn-junction diodes.

29. The memory cell of claim 28 wherein the each of the pn-junction diodes includes the respective source/drain region, and further includes a leaky region of the second dopant type having a doping concentration greater than the first doped region adjoining the respective source/drain region.

30. The memory cell of claim 27 wherein the first and second diodes are Schottky diodes.

31. The memory cell of claim 30 wherein each of the Schottky diodes comprises a second doped region of the second dopant type having a doping concentration greater than the first doped region, and a conductive layer coupling the source/drain region of the respective data node to the respective second doped region.

32. The memory cell of claim 4 wherein each of the loads is represented by junction leakage current through a reverse biased pn-junction diode.

33. The memory cell of claim 4 wherein each of the loads is represented by junction leakage current through a reverse biased Schottky diode.

34. The memory cell of claim 4 wherein the first load is represented by subthreshold leakage currents through the first access transistor from the first data node and the first access terminal, and second load is represented by subthreshold leakage currents through the second access transistor from the second data node and the second access terminal.

35. The memory cell of claim 17 wherein:

the first diode load includes the second source/drain region of the first access transistor, and further includes a first leaky region of the first dopant type contiguous with the second source/drain region of the first access transistor, the first leaky region having a doping concentration greater than the doped region; and the second diode load includes the second source/drain region of the second access transistor, and further includes a second leaky region of the first dopant type contiguous with the second source/drain region of the second access transistor, the second leaky region having a doping concentration greater than the doped region.

36. The memory cell of claim 35 wherein at least a portion of the first and second leaky regions overlap the second source/drain region of the respective access transistor.

37. The memory cell of claim 35 wherein each diode load further includes a conductive layer coupling the second source/drain region of the respective access transistor to the respective leaky region.

* * * * *

UNITED STATES PATENT AND TRADEMARK OFFICE
CERTIFICATE OF CORRECTION

PATENT NO. : 6,172,899 B1 Page 1 of 1
DATED : January 9, 2001
INVENTOR(S) : Ken Marr and H. Montgomery Manning It is certified that error appears in the above-identified patent and that said Letters Patent is hereby corrected as shown below:

<u>Title page,</u>
Item [56], References Cited, OTHER PUBLICATIONS,
Line 3, reads "Advanced Resarch" should read -- Advanced Research --.

<u>Column 11,</u>
Lines 32 and 39, "pmos" should read -- PMOS --
Lines 34 and 37, "nmos" should read -- NMOS --
Line 59, "having, first" should read -- having first --

<u>Column 12,</u>
Line 21, "pmos" should read -- PMOS --
Line 23, "nmos" should read -- NMOS --
Line 26, "nmos" should read -- NMOS --
Line 28, "pmos" should read -- PMOS --

<u>Column 14,</u>
Line 64, "a first diode load having" should read -- a first diode having --

<u>Column 15,</u>
Line 26, "wherein the each" should read -- wherein each --

Signed and Sealed this

Twenty-third Day of July, 2002

Attest:

JAMES E. ROGAN
*Attesting Officer* *Director of the United States Patent and Trademark Office*